United States Patent
Miyako (10) Patent No.: US 7,310,263 B2
(45) Date of Patent: Dec. 18, 2007

(54) ROM STORING INFORMATION BY USING PAIR OF MEMORY CELLS

(75) Inventor: Satoyuki Miyako, Yokohama (JP)

(73) Assignee: Kabushiki Kaisha Toshiba, Minato-ku, Tokyo (JP)

( * ) Notice: Subject to any disclaimer, the term of this patent is extended or adjusted under 35 U.S.C. 154(b) by 0 days.

(21) Appl. No.: 11/519,232

(22) Filed: Sep. 12, 2006

(65) Prior Publication Data

US 2007/0064465 A1    Mar. 22, 2007

(30) Foreign Application Priority Data

Sep. 16, 2005    (JP)    ............... 2005-270056

(51) Int. Cl.
*G11C 11/00*    (2006.01)
(52) U.S. Cl. ............... 365/148; 365/100; 365/189.07; 365/158
(58) Field of Classification Search ............... 365/148, 365/100, 189.07, 158, 185.19
See application file for complete search history.

(56) References Cited

U.S. PATENT DOCUMENTS 5,313,418 A    5/1994    Wada et al.
5,959,877 A    9/1999    Takahashi
6,741,490 B2 *    5/2004    Baker ............... 365/148

FOREIGN PATENT DOCUMENTS

JP    11-026607    1/1999
JP    2003-203994    7/2003

* cited by examiner

*Primary Examiner*—David Lam
(74) *Attorney, Agent, or Firm*—Banner & Witcoff, Ltd (57) ABSTRACT

Disclosed is a semiconductor device including a memory cell array, word lines, bit lines, and a signal difference determination circuit. In the memory cell array, memory cells each formed by connecting a MOS transistor and resistor in series are arranged in a matrix. The word lines are connected to the gates of the MOS transistors of the memory cells in the same row of the memory cell array. The bit lines are provided so as to correspond to the columns of the memory cell array. Each bit line is connected to one terminal of a corresponding one of the resistors of the memory cells in the same column. The signal difference determination circuit compares two output signals read to two bit lines from a pair of memory cells, thereby determining stored information in the pair of memory cells.

18 Claims, 7 Drawing Sheets

ROM STORING INFORMATION BY USING PAIR OF MEMORY CELLS

CROSS-REFERENCE TO RELATED APPLICATIONS

This application is based upon and claims the benefit of priority from prior Japanese Patent Application No. 2005-270056, filed Sep. 16, 2005, the entire contents of which are incorporated herein by reference.

BACKGROUND OF THE INVENTION

1. Field of the Invention

The present invention relates to a read-only memory (ROM) storing information by using a pair of memory cells.

2. Description of the Related Art

Conventionally, a mask ROM is programmed by using a diffusion method, contact method, via contact method, or the like as disclosed in, e.g., Jpn. Pat. Appln. KOKAI Publication No. H11-26607.

The diffusion method programs binary data in accordance with whether to form source and/or drain regions of a transistor which functions as a memory cell. When a transistor having source and drain regions is selected, this transistor is turned on to change the potential of a precharged bit line. If source and drain regions are not formed, a transistor does not function as a switch, so a bit line maintains a precharged state. Data is read by making the potential of the bit line correspond to "1" or "0" of data.

On the other hand, the contact method or via contact method programs binary data in accordance with the presence/absence of a contact or via contact of a transistor in a memory cell. Whether to transfer memory cell data to a bit line is determined in accordance with the presence/absence of the contact or via contact, and the potential of a precharged bit line changes in accordance with the presence/absence of these contacts. Data is read by making this potential change of the bit line correspond to "1" or "0" of data.

In any of the conventional mask ROMs described above, however, data is programmed by using a mask during the fabrication process, so the data cannot be rewritten after the fabrication. Also, the mask ROM cannot be given the function of a monitor tool for detecting variations in the element formation process or inconveniences after the device is fabricated.

Note that the above-mentioned mask ROM is a nonvolatile storage circuit which stores one-bit information at one address. However, Jpn. Pat. Appln. KOKAI Publication No. P2003-203994, for example, has disclosed a technique which determines binary data by using the result of comparison of the electrical characteristics of a pair of a PMOS transistor and NMOS transistor.

BRIEF SUMMARY OF THE INVENTION

A semiconductor device according to an aspect of the present invention comprising a memory cell array in which memory cells are arranged in a matrix, each of the memory cells being formed by connecting a current path of a MOS transistor and a resistor in series, and one-bit information being stored by using a pair of memory cells, a word line connected to gates of MOS transistors in memory cells in the same row of the memory cell array, a plurality of bit lines provided so as to correspond to columns in the memory cell array, each of the plurality of bit lines being connected to one terminal of a corresponding one of resistors in memory cells in the same column, and a read circuit configured to determine one-bit stored information stored in the pair of memory cells, the read circuit determining the stored information by comparing two output signals read to two bit lines from the pair of memory cells comprising a memory cell in one column and a memory cell in another column of the memory cell array, wherein the stored information in the pair of memory cells is determined in accordance with whether a difference between resistance values of the resistors in the pair of memory cells is smaller than a predetermined value.

DETAILED DESCRIPTION OF THE INVENTION

First Embodiment

Figure 1:
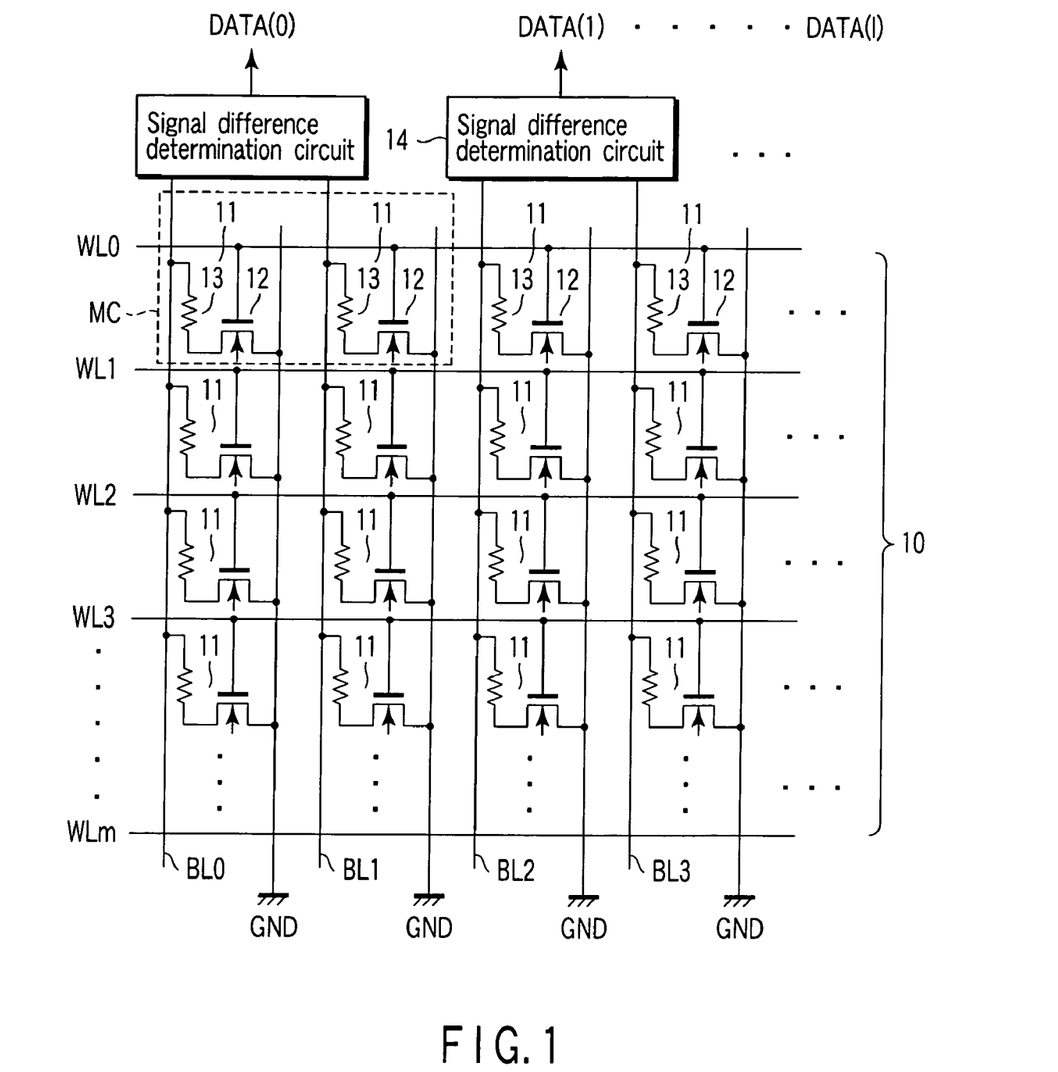
FIG. 1 is an equivalent circuit diagram which explains a semiconductor device according to the first embodiment of the present invention, and shows a portion of a ROM.

FIG. 1 is an equivalent circuit diagram which explains a semiconductor device according to the first embodiment of the present invention, and shows a portion of a ROM. A memory cell array 10 comprises a plurality of memory cells 11 arranged in a matrix, word lines WLi (i=0, 1, 2, 3, ..., m) formed in correspondence with the rows, and bit lines BLj (j=0, 1, 2, 3, ..., n) formed in correspondence with the columns.

In this embodiment, each memory cell 11 comprises an NMOS transistor 12, and a resistor 13 connected in series with the current path of the MOS transistor 12. One end of the current path of the MOS transistor 12 is connected to a ground point GND via a source line. The gates of the MOS transistors 12 in the memory cells 11 arranged in the same row are connected together to one of the word lines WLi. One terminal of each of the resistors 13 in the memory cells 11 arranged in the same column is connected to a corresponding one of the bit lines BLj.

In two columns, i.e., two adjacent columns in this embodiment, of the memory cell array 10 described above, memory cells (a pair of memory cells) connected to the same word line store one-bit information. More specifically, of the memory cells 11 in one row connected to, e.g., the word line WL0, a first memory cell connected to the bit line BL0 and a second memory cell connected to the bit line BL1 form a one-bit memory cell MC.

A read circuit, e.g., a signal difference determination circuit 14 is connected to each of the pairs of bit lines BL0 and BL1, BL2 and BL3, . . . . The signal difference determination circuit 14 determines one-bit stored information by comparing two signals read from the pair of memory cells to the pair of bit lines.

When the word line WL0, for example, is selected in the circuit shown in FIG. 1, data of the one-bit memory cells MC (the pairs of memory cells 11) are input to the signal difference determination circuits 14 via the pairs of bit lines BL0 and BL1, BL2 and BL3, . . . . Each signal difference determination circuit 14 determines the stored information of the pair of memory cells on the basis of the relativity of the two corresponding input signals. In this embodiment, for example, the signal difference determination circuit 14 determines whether the level difference between the two input signals is equal to or smaller than a predetermined difference, and outputs the determination result so that it corresponds to "1" or "0" of binary data.

Figure 2:
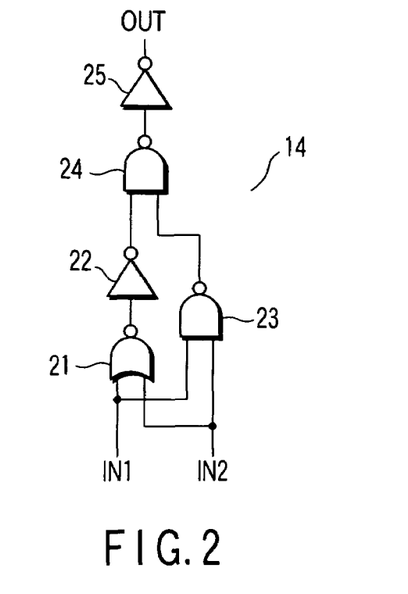
FIG. 2 is a circuit diagram showing an example of the arrangement of a signal difference determination circuit as a practical example of a read circuit shown in FIG. 1.

FIG. 2 is a circuit diagram showing a practical example of the signal difference determination circuit 14 shown in FIG. 1. The signal difference determination circuit 14 comprises a two-input NOR circuit 21, inverter circuit 22, two-input NAND circuit 23, two-input NAND circuit 24, and inverter circuit 25. The NOR circuit 21 receives signals IN1 and IN2 from a pair of bit lines. The inverter circuit 22 inverts the output signal from the NOR circuit 21, and supplies the inverted signal to one input terminal of the NAND circuit 24. The NAND circuit 23 also receives the signals IN1 and IN2 of the bit lines. The NAND circuit 23 applies its output signal to the other input terminal of the NAND circuit 24. The inverter circuit 25 inverts the output signal from the NAND circuit 24, thereby generating an output signal OUT.

Figure 3:
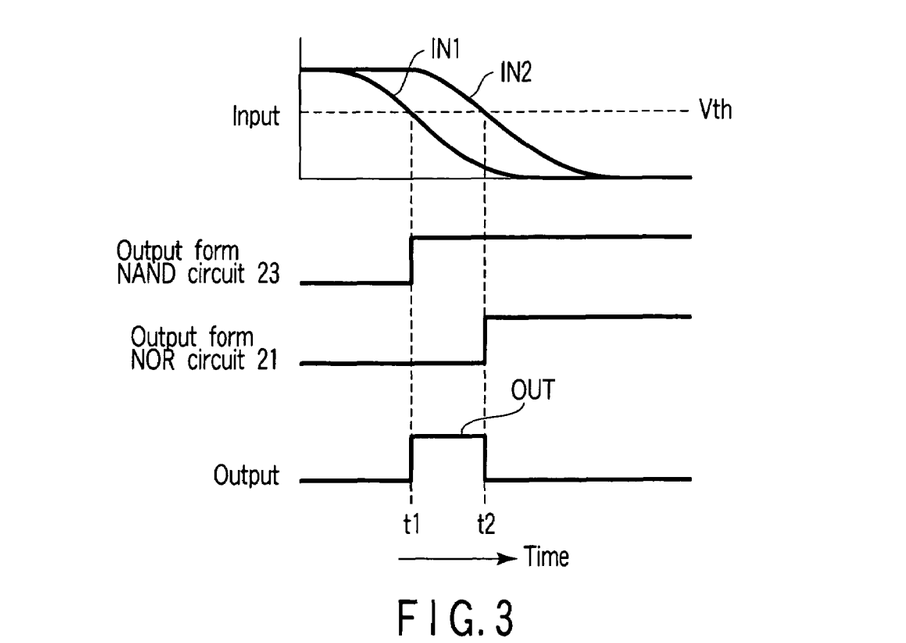
FIG. 3 is a timing chart showing an example of the operation of the signal difference determination circuit shown in FIG. 2.

FIG. 3 is a timing chart showing an example of the operation of the signal difference determination circuit 14 shown in FIG. 2. The signal difference determination circuit 14 shown in FIG. 2 binarizes the two input signals IN1 and IN2 by using one threshold voltage Vth, changes its output in accordance with whether the logic levels of the two signals are the same (in accordance with the logic level difference between the two signals), and outputs a time period during which the two logic levels are different as a pulse waveform.

That is, when the input signal IN1 becomes lower than the threshold voltage Vth at the timing of t1, the output from the NAND circuit 23 inverts from Low level to High level. Consequently, the output from the NAND circuit 24 goes low and the output OUT from the inverter circuit 25 goes high. Also, when the input signal IN2 becomes lower than the threshold voltage Vth at the timing of t2, the output from the NOR circuit 21 inverts from low to high. The output from the inverter circuit 22 goes low and the output from the NAND circuit 24 goes high because the output from the NAND circuit 23 is high. As a consequence, the output OUT from the inverter circuit 25 goes low.

In the above arrangement, stored information is preset at the time of design by adjusting the resistance value of the resistor 13 of the memory cell 11. That is, data of a pair of memory cells is determined in accordance with whether the difference between the resistance values of the resistors in the pair of memory cells is smaller than a predetermined value.

In the semiconductor device according to this first embodiment of the present invention, program is performed by changing the resistance value of the resistor 13 in the memory cell 11. The resistance value of the resistor 13 is changed by using a trimming technique such as ion irradiation, laser irradiation, or heat irradiation.

Accordingly, the resistance value can be changed and programmed either during or after the process of fabricating the device on a semiconductor wafer (the element formation process).

Furthermore, if variations in the element formation process produce unexpected variations in, e.g., resistance of the transistor 12, resistor 13, contact, and metal interconnection in the memory cell 11, or resistance of a via contact which connects interconnection layers, the actual wafer measurement results become different from the expected values (the contents prestored at the time of design). Therefore, a comparator is provided in a read circuit, the memory can also be used as a monitor tool for readily detecting the process variations or the inconveniences of the device after the element formation process by comparing the actual wafer measurement results with the expected values.

Second Embodiment

Figure 4:
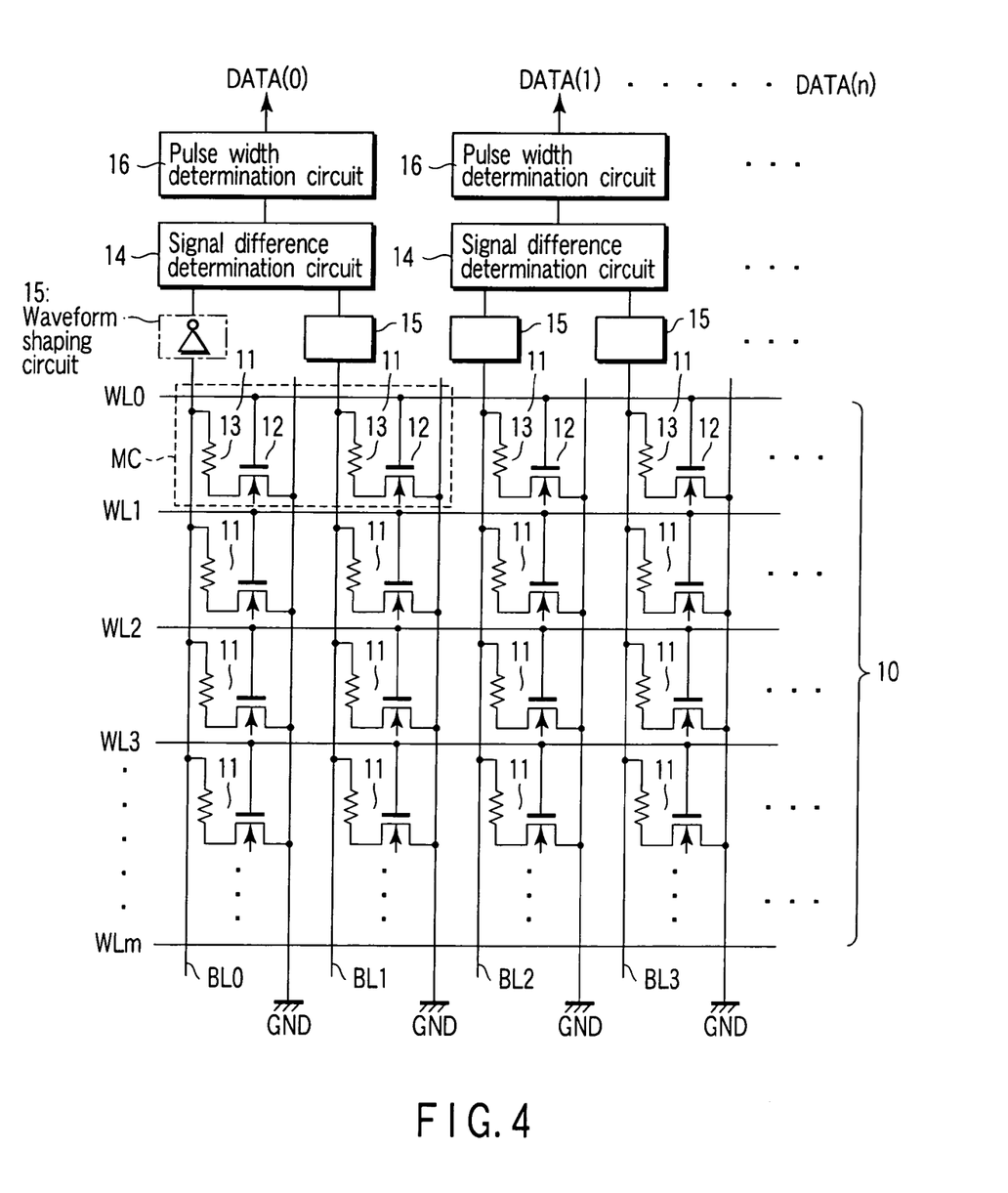
FIG. 4 is an equivalent circuit diagram which explains a semiconductor device according to the second embodiment of the present invention, and shows a portion of a ROM.

FIG. 4 is an equivalent circuit diagram which explains a semiconductor device according to the second embodiment of the present invention, shows a portion of a ROM. This ROM shown in FIG. 4 is the same as the ROM shown in FIG. 1 except for the arrangement of a read circuit. The read circuit comprises a plurality of sets of waveform shaping circuits 15 formed in correspondence with bit lines, signal difference determination circuits 14, and pulse width determination circuits 16. Each waveform shaping circuit 15 includes an inverter circuit having an input terminal connected to the bit line. The waveform shaping circuits 15 in one set shape the waveforms of two output signals read from a one-bit memory cell MC (a pair of memory cells) in association with each other. The signal difference determination circuit 14 changes its output in accordance with whether the logic levels of the output signals from the two waveform shaping circuits 15 in one set are the same, and outputs a signal having the pulse width of a period during which the two logic levels are different. Also, the pulse width determination circuit 16 determines whether the pulse width of the output signal from the signal difference determination circuit 14 is equal to or larger than a predetermined time width, and outputs the determination result as a column data output DATA(k) (k=0, 1, . . . , n).

Figure 5:
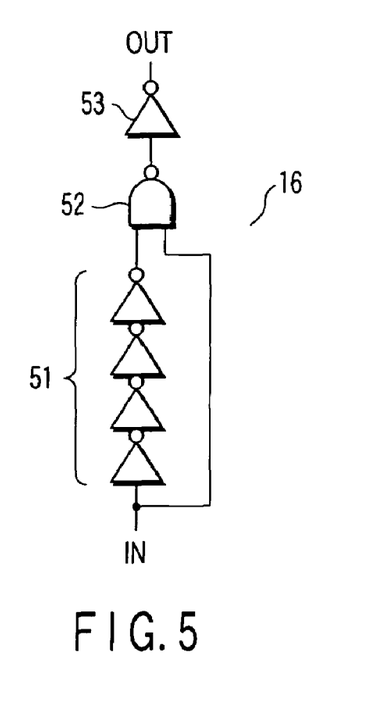
FIG. 5 is a circuit diagram showing a practical example of a pulse width determination circuit shown in FIG. 4.

FIG. 5 is a circuit diagram showing a practical example of the pulse width determination circuit 16 shown in FIG. 4. The pulse width determination circuit 16 comprises a delay circuit 51, two-input NAND circuit 52, and inverter circuit 53. The delay circuit 51 includes, e.g., a plurality of stages of inverter circuits which delay an input signal IN by a predetermined time. The NAND circuit 52 receives the output signal from the delay circuit 51 and the input signal IN. The inverter circuit 53 inverts the output signal from the NAND circuit 52, and outputs an output signal OUT.

Figure 6:
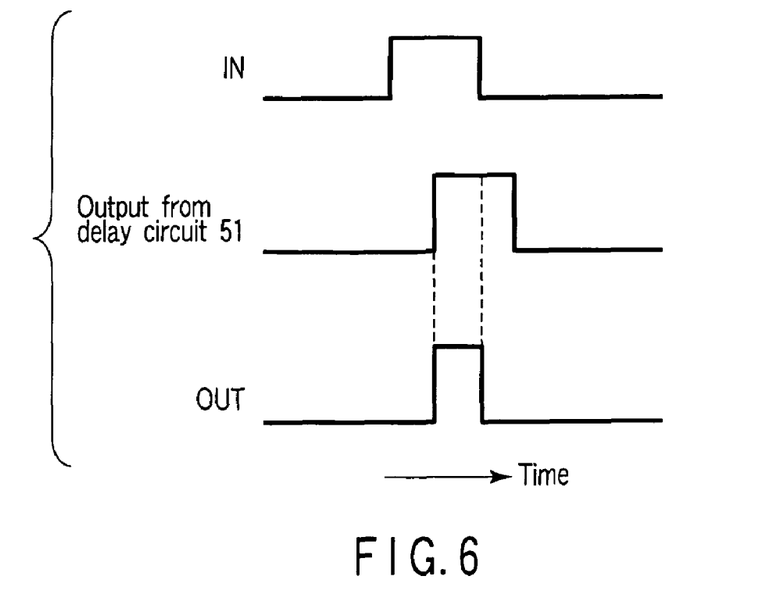
FIG. 6 is a timing chart showing an example of the operation of the pulse width determination circuit shown in FIG. 5.

As shown in FIG. 6, the pulse width determination circuit 16 outputs pulse signals having different logic levels in accordance with whether the pulse width of the input signal IN is equal to or larger than the delay time of the delay circuit 51. Note that the arrangement and operation of the signal difference determination circuit 14 shown in FIG. 4 are the same as described above with reference to FIGS. 2 and 3.

The operation of the ROM shown in FIG. 4 will be explained below. When a word line WL0, for example, is selected, data of the one-bit memory cells MC (pairs of memory cells 11) are input to the pairs of waveform shaping circuits 15 via pairs of bit lines BL0 and BL1, BL2 and BL3, . . . . Each pair of waveform shaping circuits 15 shape the waveforms of the data of the pair of memory cells, and supply the data to the signal difference determination circuit 14. The signal difference determination circuit 14 determines the stored information of the pair of memory cells 11 on the basis of the relativity of the two corresponding input signals.

This embodiment determines whether a logic level difference is produced between two input signals in accordance with the output pulse width difference from the two waveform shaping circuits 15 corresponding to the level difference between the signals read from the two memory cells 11. A period during which the two logic levels are different is output as a pulse waveform (logic signal) to the pulse width determination circuit 16. The pulse width determination circuit 16 determines whether the pulse width of the input signal is equal to or larger than a predetermined time width (in this embodiment, the time width set by the delay circuit 51), and outputs the determination result.

The second embodiment can also achieve the same effects as in the first embodiment described above. In addition, even when the output from the signal difference determination circuit 14 causes an unstable pulse transition such as low→high→low or high→low→high, the output changes in accordance with the result of determination of the pulse width of the signal difference determination output. Accordingly, an accurate output can be obtained more stably than in the first embodiment.

(Modification to Second Embodiment)

The second embodiment described above is modified so as to comprise a plurality of pulse width determination circuits 16 having different determination pulse widths with respect to the output from one signal difference determination circuit 14. This implements a multilevel storage ROM in which determination outputs corresponding to the individual levels of multilevel stored information can be obtained by the plurality of pulse width determination circuits 16. In addition, the device variation level can be detected on the basis of the determination output from each pulse width determination circuit 16. Therefore, this ROM can also be used as a tool for detecting a defective device as in the first embodiment.

Note that in the first and second embodiments described above, various resistances can be used as the resistor 13 in the memory cell 11. Examples are the resistance of a metal interconnection, the resistance of a contact, the resistance of a via contact which connects interconnection layers, the resistance of a polysilicon interconnection having a silicidized surface, the resistance of a diffusion region, the resistance of a well region, the on-resistance of a transistor, and the resistance of a polysilicon interconnection. In this case, a pair of memory cells can be given a resistance value difference by changing, e.g., the length or thickness of a metal interconnection, the number of contacts, or the number of via contacts.

It is not necessary to form waveform shaping circuits 15 in the second embodiment. Further, pulse width determination circuit 16 is not limited to the composition shown in FIG. 5, and it may input another signal for controlling pulse width from the exterior instead of providing delay circuit 51 for example.

Third Embodiment

Figure 7:
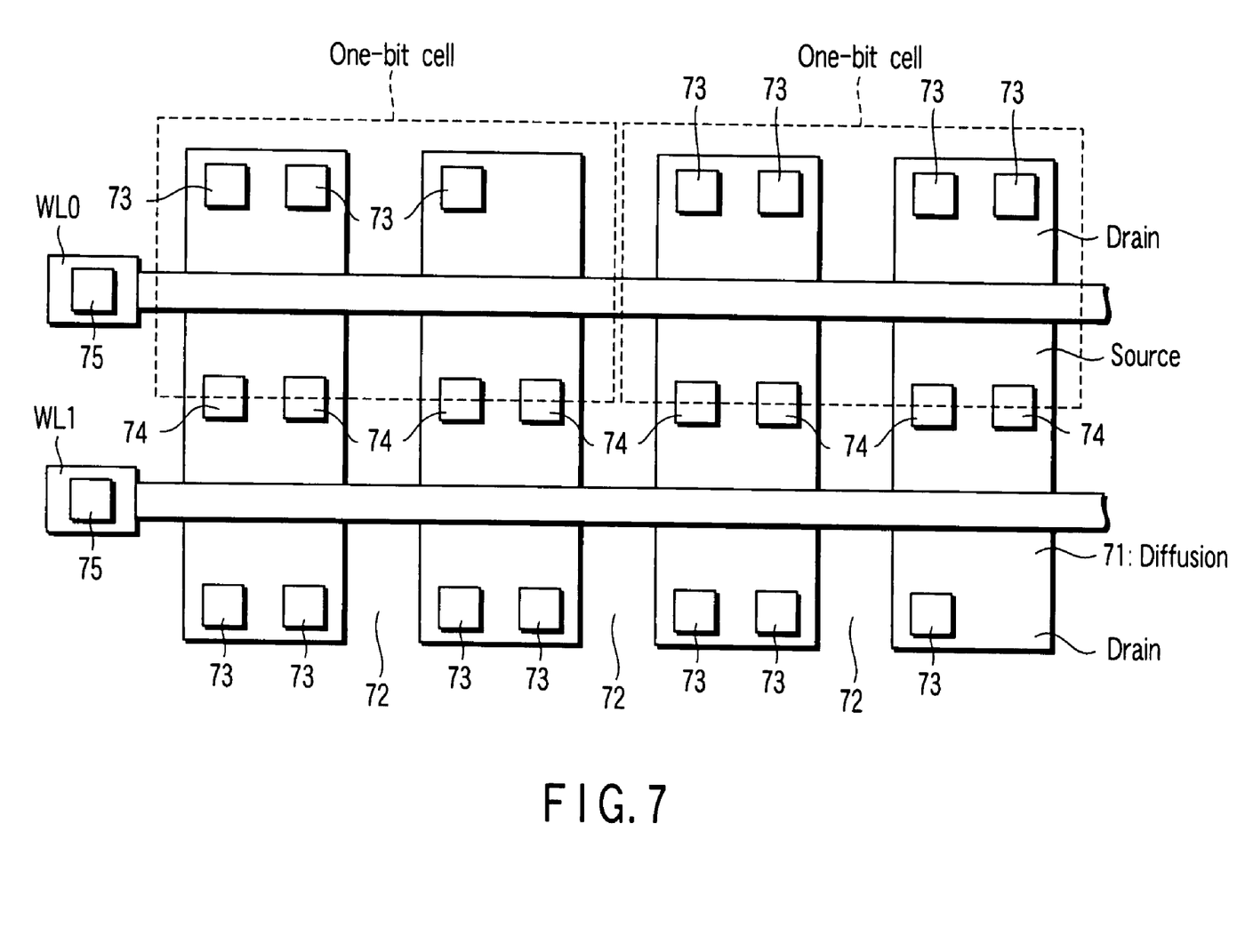
FIG. 7 is a plan view showing a portion of the pattern layout of memory cells in the first and second embodiments.

FIG. 7 is a plan view showing an example of the pattern layout of the memory cells 11 in the first and second embodiments described above. A plurality of diffusion regions 71 are isolated by element isolation regions 72 in the surface layer of a semiconductor layer, and arranged in a matrix. Each of the diffusion regions 71 includes active regions (a source region, drain region, and channel region).

In this embodiment, the active regions of two memory cells 11 are formed in each diffusion region 71. MOS transistors 12 of the two memory cells 11 have isolated drain regions, and share the source region. A drain contact 73 connects the drain region of the MOS transistor 12 of the memory cell 11 and an upper interconnection layer. A source contact 74 connects the source region of the MOS transistor 12 of the memory cell 11 and the upper interconnection layer. A word line WLi made of a polysilicon layer is connected to the gates of the MOS transistors 12 of the memory cells 11 in the same row. A via contact 75 connects the word line WLi and the upper interconnection layer.

FIG. 7 shows an example in which the pairs of memory cells MC are formed in diffusion regions 71 separately each other. In this case, at least one pair of memory cells are formed so that the number of contacts in contact with the drain region or source region of the MOS transistor 12 or the number of via contacts in one memory cell differs from that in the other. This makes it possible to generate an output difference corresponding to the resistance difference between the contacts, as the output from the two memory cells. This embodiment shows an example of a pair of memory cells (one-bit cell) in which the number of contacts 73 in contact with the drain region of the MOS transistor in a first memory cell is two, and the number of contacts 73 in contact with the drain region of the MOS transistor in a second memory cell is one.

(Modification to Third Embodiment)

Figure 8:
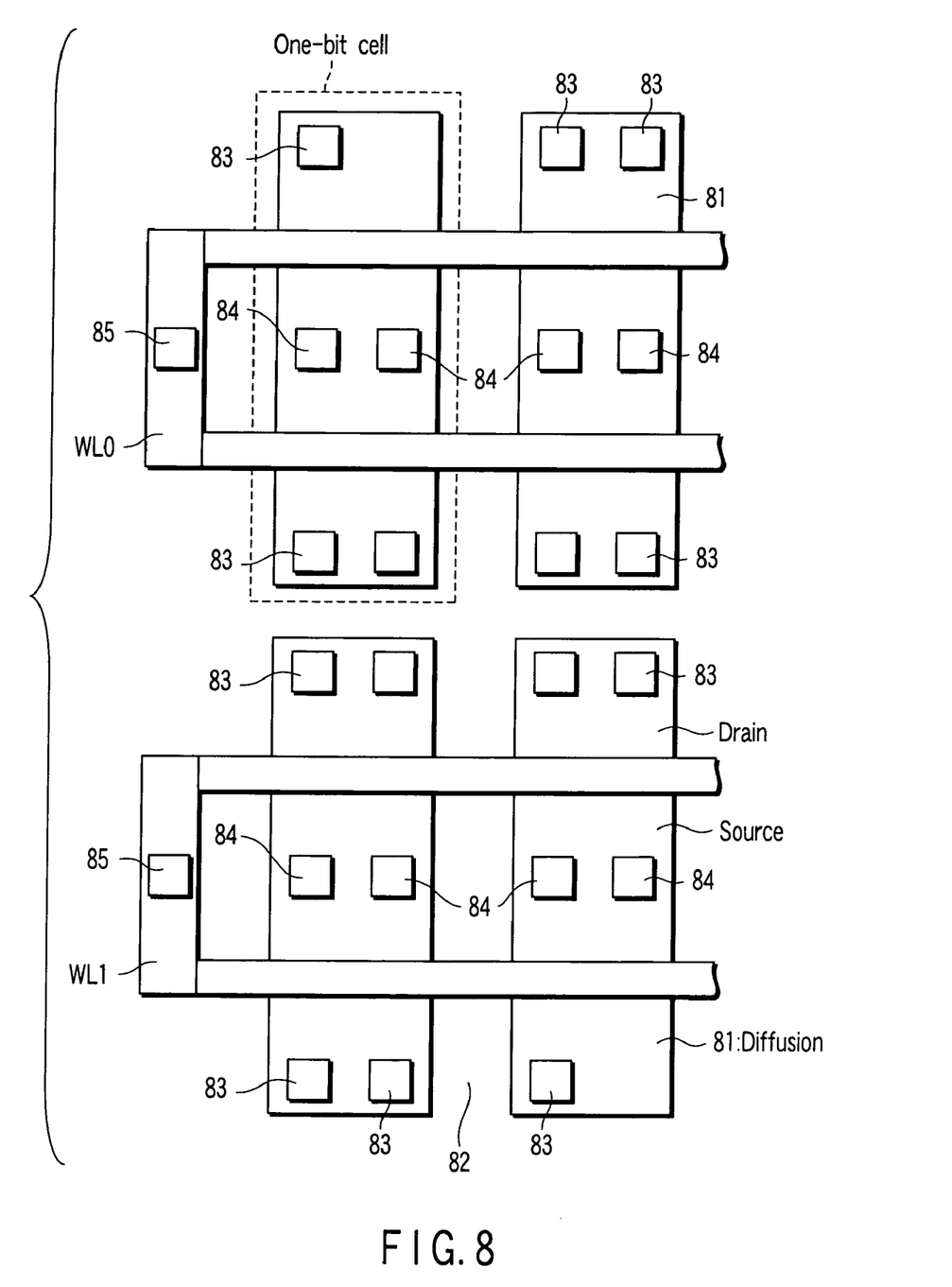
FIG. 8 is a plan view showing a modification of the pattern layout of the memory cells shown in FIG. 7.

FIG. 8 is a plan view showing a modification of the pattern layout of the memory cells shown in FIG. 7. FIG. 8 shows an example in which the active regions of a pair of memory cells forming a one-bit memory cell are formed in one diffusion region 81. A plurality of diffusion regions 81 are isolated by element isolation regions 82 in the surface layer of a semiconductor layer, and arranged in a matrix. Each of the diffusion regions 81 includes active regions (a source region, drain region, and channel region).

In this modification, the active regions of two memory cells are formed in each diffusion region 81. MOS transistors of the two memory cells have isolated drain regions, and share the source region. A drain contact 83 connects the drain region of the MOS transistor in the memory cell and an upper interconnection layer. A source contact 84 connects the source region of the MOS transistor in the memory cell and the upper interconnection layer. A word line WLi made of a polysilicon layer is connected to the gates of the MOS transistors of the memory cells in the same row. The word lines WLi on the same active region 81 are connected together. A via contact 85 connects the word line WLi and the upper interconnection layer.

At least one pair of memory cells MC are formed so that the number of contacts in contact with the drain region or source region of the MOS transistor or the number of via contacts which connect the interconnection layers in one memory cell differs from that in the other, in this pattern layout shown in FIG. 8 as well. This makes it possible to generate an output difference corresponding to the resistance difference between the contacts, as the output from the two memory cells. This modification shows an example of a pair of memory cells (one-bit cell) in which the number of contacts 83 in contact with the drain region of the MOS transistor in a first memory cell is one, and the number of contacts 83 in contact with the drain region of the MOS transistor in a second memory cell is two.

Fourth Embodiment

Figure 9A:
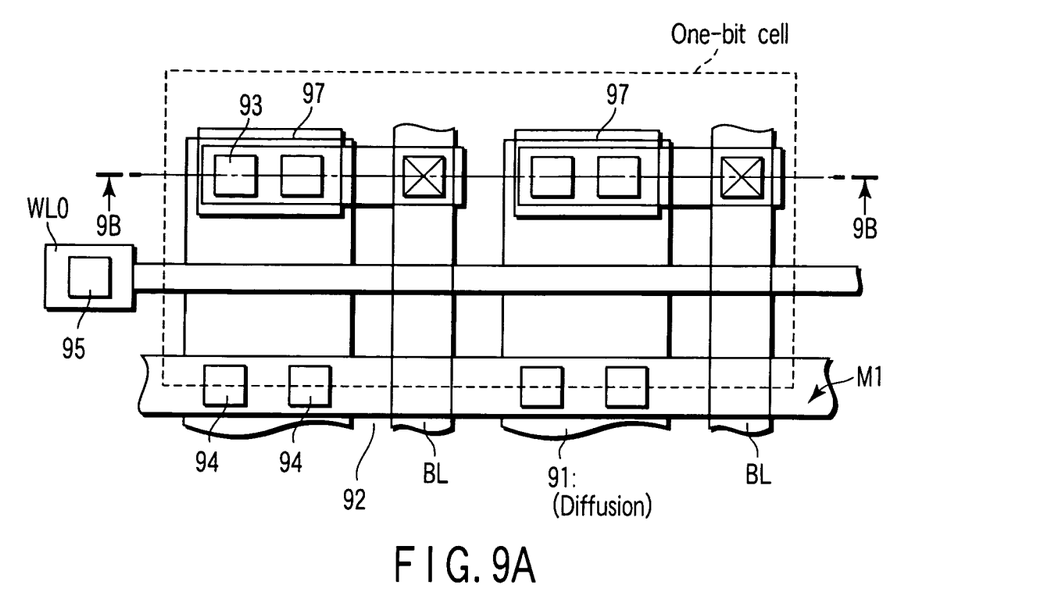
FIG. 9A is a plan view showing a portion of the pattern layout of a pair of memory cells shown in FIG. 7.
Figure 9B:
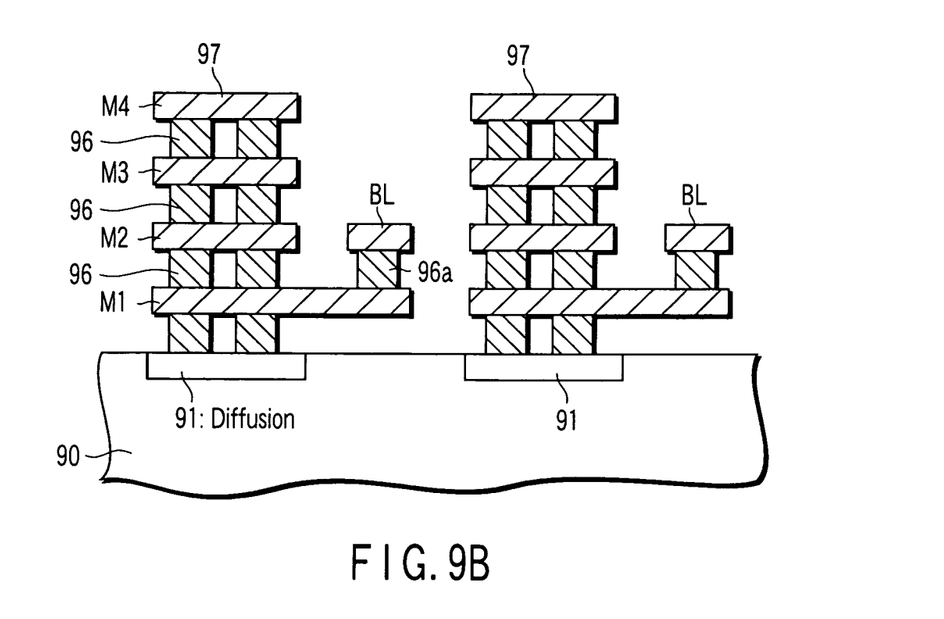
FIG. 9B is a sectional view schematically showing the portion of the pattern layout of the pair of memory cells shown in FIG. 7.

This fourth embodiment is directed to the interconnection structure of the memory cell in the first and second embodiments described above. FIG. 9A is a plan view showing a portion of a pattern layout when a pair of memory cells shown in FIG. 7 have the same number of contacts. FIG. 9B is a sectional view schematically showing a sectional structure taken along a line 9B-9B in FIG. 9A.

Referring to FIGS. 9A and 9B, a plurality of diffusion regions 91 are isolated by element isolation regions 92 in the surface layer of a semiconductor layer, and arranged in a matrix. Each of the diffusion regions 91 includes active regions (a source region, drain region, and channel region). In this embodiment, the active regions of two memory cells are formed in each diffusion region 91. MOS transistors in the two memory cells have isolated drain regions, and share the source region. A drain contact 93 connects the drain region of the MOS transistor in the memory cell and an upper interconnection layer. A source contact 94 connects the source region of the MOS transistor in the memory cell and the upper interconnection layer. A word line WLi made of a polysilicon layer is connected to the gates of the MOS transistors of the memory cells in the same row. A via contact 95 connects the word line WLi and the upper interconnection layer. Metal interconnection layers M1 to M4 are first to fourth (uppermost) interconnection layers, and via contacts 96 connect these interconnection layers.

In this embodiment, a portion of an intermediate layer, e.g., the second metal interconnection layer M2 is extracted to a bit line BL through a via contact 96a. The second metal interconnection layer M2 is extracted to an interconnection layer terminal pattern 97 made of the interconnection pattern of the uppermost interconnection layer M4. That is, each memory cell described above has a first interconnection path connected to the bit line BL and a second interconnection path connected to the interconnection layer terminal pattern 97. The interconnection layer terminal pattern 97 is formed in a position at which the resistance value of the second interconnection path can be changed by trimming such as ion irradiation, laser irradiation, or heat irradiation. More specifically, the interconnection layer terminal pattern 97 is formed in a position, e.g., on each memory cell, at which the resistance value of the memory cell can be changed.

The fourth embodiment achieves the same effects as in the first embodiment. In addition, during or after the process of forming elements on a semiconductor wafer, the resistance value of each memory cell can be changed by directly influencing, e.g., the diffusion region, contact, or metal interconnection from the MOS transistor of the memory cell to the bit line by using the trimming technique. As a consequence, the output from the read circuit can be changed. This also makes it possible to increase the ease of trimming of the resistance in the memory cell during or after the element formation process. It is also possible to monitor the output signal from the memory cell for the purpose of analysis after the element formation.

As described above, according to one aspect of this invention, information can be stored by using a pair of memory cells. In addition, the stored information can be rewritten by trimming the resistance in the memory cell. Furthermore, the memory can also achieve the function of a monitor tool for readily detecting variations in the element formation process or the inconvenience of the device after the element formation process.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
a memory cell array in which memory cells are arranged in a matrix, each of the memory cells being formed by connecting a current path of a MOS transistor and a resistor in series, and one-bit information being stored by using a pair of memory cells;
a word line connected to gates of MOS transistors in memory cells in the same row of the memory cell array;
a plurality of bit lines provided so as to correspond to columns in the memory cell array, each of the plurality of bit lines being connected to one terminal of a corresponding one of resistors in memory cells in the same column; and
a read circuit configured to determine one-bit stored information stored in the pair of memory cells, the read circuit determining the stored information by comparing two output signals read to two bit lines from the pair of memory cells comprising a memory cell in one column and a memory cell in another column of the memory cell array,
wherein the stored information in the pair of memory cells is determined in accordance with whether a difference between resistance values of the resistors in the pair of memory cells is smaller than a predetermined value.

2. The device according to claim 1, wherein the read circuit comprises a signal difference determination circuit configured to receive the two output signals read from the pair of memory cells, determine whether a level difference between the two input signals is not more than a predetermined difference, and output a determination result.

3. The device according to claim 2, wherein the signal difference determination circuit comprises a NOR circuit which receives the two output signals read from the pair of memory cells, a first inverter circuit which inverts an output signal from the NOR circuit, a first NAND circuit which receives the two output signals read from the pair of memory cells, a second NAND circuit which receives an output signal from the first inverter circuit and an output signal from the first NAND circuit, and a second inverter circuit which inverts an output signal from the second NAND circuit.

4. The device according to claim 1, wherein the read circuit comprises:
a signal difference determination circuit configured to change an output in accordance with whether logic levels of output signals from two waveform shaping circuits in each set are the same, and output a time period during which the two logic levels are different as a pulse waveform; and a pulse width determination circuit configured to determine whether a pulse width of an output signal from the signal difference determination circuit is not less than a predetermined time width, and output a determination result.

5. The device according to claim 1, wherein the read circuit comprises:

a plurality of sets of waveform shaping circuits configured to shape waveforms of the two output signals read from the pair of memory cells;

a signal difference determination circuit configured to change an output in accordance with whether logic levels of output signals from two waveform shaping circuits in each set are the same, and output a time period during which the two logic levels are different as a pulse waveform; and a pulse width determination circuit configured to determine whether a pulse width of an output signal from the signal difference determination circuit is not less than a predetermined time width, and output a determination result.

6. The device according to claim 5, wherein the waveform shaping circuit comprises a first inverter circuit whose input terminal is connected to the bit line.

7. The device according to claim 6, wherein the signal difference determination circuit comprises a NOR circuit which receives the two output signals from two first inverter circuits, a second inverter circuit which inverts an output signal from the NOR circuit, a first NAND circuit which receives the two output signals read from the pair of memory cells, a second NAND circuit which receives an output signal from the second inverter circuit and an output signal from the first NAND circuit, and a third inverter circuit which inverts an output signal from the second NAND circuit.

8. The device according to claim 7, wherein the pulse width determination circuit comprises a delay circuit which delays an output signal from the third inverter circuit, a third NAND circuit which receives an output signal from the third circuit and an output signal from the delay circuit, and a fourth inverter circuit which inverts an output signal from the third NAND circuit.

9. The device according to claim 7, wherein the pulse width determination circuit comprises a third NAND circuit which receives the output signal from the third inverter circuit and a signal for controlling pulse width from the exterior, and a fourth inverter circuit which inverts an output signal from the third NAND circuit.

10. The device according to claim 1, wherein the resistor comprises at least one of a resistance of a metal interconnection, a resistance of a contact, a resistance of a via contact, a resistance of a polysilicon interconnection whose surface is silicidized, a resistance of a diffusion region, a resistance of a well region, an on-resistance of a transistor, and a resistance of a polysilicon interconnection.

11. The device according to claim 10, wherein the resistance of a contact controlled a number of the contacts between the memory cells in the pair of memory cells.

12. The device according to claim 10, wherein the resistance of a via contact controlled a number of the via contacts between the memory cells in the pair of memory cells.

13. The device according to claim 10, wherein trimming of one resistor in the pair of memory cells is carried out by either ion irradiation, laser irradiation and heat irradiation, and the pair of memory cells is programmed when resistance changes.

14. The device according to claim 13, wherein each memory cell is formed in the diffusion regions mutually separated by the element isolation region, and the pair of memory cells are formed in two diffusion region.

15. The device according to claim 13, wherein each memory cell is formed in the diffusion regions mutually separated by the element isolation region, and the pair of memory cells are formed in one diffusion region.

16. The device according to claim 1, wherein each memory cell comprises a first interconnection path between the memory cell and the bit line, and a second interconnection path between the memory cell and an interconnection pattern different from the bit line, and the second interconnection path is formed in a position at which a resistance value changes by trimming.

17. The device according to claim 16, wherein the first interconnection path is a metal interconnection, the metal interconnection lead out from a part of an inter-level layer through a via contact, and the second interconnection path is a metal interconnection which lead out from a top of the inter-level layer through the via contact interconnection terminal pattern.

18. The device according to claim 16, wherein the second interconnection path is arranged on the each memory cell.

* * * * *